(12) United States Patent
Oshio

(10) Patent No.: US 7,474,033 B2
(45) Date of Patent: Jan. 6, 2009

(54) SURFACE ACOUSTIC WAVE DEVICE, METHOD OF MANUFACTURING THE SAME, AND ELECTRONIC APPARATUS

(75) Inventor: Masahiro Oshio, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 244 days.

(21) Appl. No.: 11/147,220

(22) Filed: Jun. 8, 2005

(65) Prior Publication Data

US 2005/0275309 A1    Dec. 15, 2005

(30) Foreign Application Priority Data

Jun. 9, 2004  (JP) .............. 2004-171163
Apr. 18, 2005  (JP) .............. 2005-119323

(51) Int. Cl.
*H01L 41/00* (2006.01)

(52) U.S. Cl. .............. 310/313 A; 310/313 B; 310/313 D; 310/313 R

(58) Field of Classification Search ............ 310/313 B, 310/313 R, 313 A
See application file for complete search history.

(56) References Cited

U.S. PATENT DOCUMENTS

| | | | | |
|---|---|---|---|---|
| 4,719,383 | A | * | 1/1988 | Wang et al. ............... 310/324 |
| 6,037,399 | A | * | 3/2000 | Kobayashi et al. ....... 310/313 A |
| 6,037,699 | A | * | 3/2000 | Kobayashi et al. ....... 310/313 A |
| 6,310,424 | B1 | * | 10/2001 | Ogura et al. ............ 310/313 R |
| 6,564,439 | B1 | | 5/2003 | Takata et al. |
| 6,789,297 | B2 | | 9/2004 | Takata et al. |
| 6,810,566 | B2 | | 9/2004 | Takata et al. |
| 7,067,956 | B2 | | 6/2006 | Imai et al. |
| 2004/0164645 | A1 | | 8/2004 | Oshio ..................... 310/313 |
| 2004/0164821 | A1 | | 8/2004 | Oshio ..................... 333/193 |

FOREIGN PATENT DOCUMENTS

| | | | |
|---|---|---|---|
| JP | 05-014100 | | 1/1993 |
| JP | 06112763 | A * | 4/1994 |
| JP | A 06-112763 | | 4/1994 |
| JP | A 08-316781 | | 11/1996 |
| JP | A 10-084245 | | 3/1998 |
| JP | 11-205076 | | 7/1999 |
| JP | 2004-96677 | A | 3/2000 |
| JP | 2000-315928 | A | 11/2000 |
| JP | 2003-69380 | A | 2/2003 |

OTHER PUBLICATIONS

De Zhang et al., "Study of Propagation Properties of Quasi-longitudinal Leaky Surface Acoustic Wave Propagating on Y-Rotated Cut Quartz Substrates," *IEEE Ultrasonics Symposium*, pp. 321-324 {1999}.

(Continued)

*Primary Examiner*—Jaydi A San Martin
*Assistant Examiner*—Bryan P Gordon
(74) *Attorney, Agent, or Firm*—Oliff & Berridge, PLC

(57) ABSTRACT

A surface acoustic wave device, comprising a lithium-tantalate substrate and an IDT electrode that excites a pseudo-longitudinal wave type leaky surface acoustic wave in the surface of the lithium-tantalate substrate, wherein a normalized substrate thickness $t/\lambda$, which is a thickness t of the lithium-tantalate substrate normalized by an IDT wavelength $\lambda$, is in a range of $1 \leq t/\lambda \leq 22$.

7 Claims, 10 Drawing Sheets

OTHER PUBLICATIONS

Avramov, "High Performance GHz Range Surface Transverse Wave Resonant Devices. Applications to Low-Noise Microwave Oscillators and Communication Systems," *International Meeting on Future Trends of Acoustic Wave Devices*, pp. 132-137 {1996}.

Yong et al., "Analysis of High Velocity Pseudo-Surface Acoustic Waves (HVPSAW) in Quartz Periodic Structures with Electrode Fingers," *IEEE/EIA International Frequency Control Symposium and Exhibition*, pp. 301-306 {2000}.

* cited by examiner

SURFACE ACOUSTIC WAVE DEVICE, METHOD OF MANUFACTURING THE SAME, AND ELECTRONIC APPARATUS

BACKGROUND OF THE INVENTION

1. Technical Field

The present invention relates to a surface acoustic wave device using a pseudo-longitudinal wave type leaky surface acoustic wave, a method of manufacturing the surface acoustic wave device, and an electronic apparatus using the surface acoustic wave device.

2. Related Art

A surface acoustic wave device is comprised of a surface acoustic wave element having an IDT electrode provided in the surface of a piezo-electric substrate, and is used in telecommunications apparatus and the like as circuit elements, such as a resonator and a filter.

As the surface acoustic wave used for the surface acoustic wave device, Rayleigh wave and a leaky surface acoustic wave (Leaky wave) are mainly used.

The Rayleigh wave is a surface wave propagating in the surface of an elastic body, and the energy thereof propagates without radiating into the piezo-electric substrate. Although there exist three types of volume waves (bulk waves); a "slow transversal wave", a "fast transversal wave", and a "longitudinal wave" in the piezo-electric substrate, this Rayleigh wave propagates with a phase velocity further slower than the "slow transversal wave."

Moreover, the leaky surface acoustic wave is a surface acoustic wave propagating while radiating energy in the depth direction of the elastic body (a piezo electric crystal), and can be used in a specific cut-out angle and in a specific propagation direction of the piezo-electric substrate. This leaky surface acoustic wave propagates with a phase velocity of between the "slow transversal wave" and the "fast transversal wave."

Properties of the surface acoustic wave device depend on the propagation properties of the surface acoustic wave propagating in the piezo-electric substrate, and use of the surface acoustic wave with a fast phase velocity is being required in order to cope with the direction of higher frequencies of the surface acoustic wave device.

Recently, the theory of the leaky surface acoustic wave has been developed to disclose applications to surface acoustic wave devices of the pseudo-longitudinal type leaky surface acoustic wave, which propagates with a fast phase velocity of between the "fast transversal wave" and the "longitudinal wave" while radiating two transversal-wave components into the piezo-electric substrate as the volume wave, and wherein most of the displacements in the substrate surface are composed of longitudinal wave components.

Because the phase velocity of the pseudo-longitudinal wave type leaky surface acoustic wave is fast, there is a possibility to easily realize higher frequencies of the surface acoustic wave device, which has been difficult to realize with the Rayleigh wave, the leaky surface acoustic wave or the like.

In particular, the higher frequency of the surface acoustic wave device is expected to be attained by employing lithium tantalate ($LiTaO_3$), lithium niobate ($LiNbO_3$), and tetraboric-acid lithium ($Li_2B_4O_7$) having a large electromechanical coupling coefficient, as the substrate material.

For example, it has been disclosed that a pseudo-longitudinal wave type leaky surface acoustic wave having a large phase velocity of 5,000 (m/s) through 7,500 (m/s) and a small propagation loss can be used by specifying the cut-out angle of the substrate surface in the tetraboric-acid lithium substrate (refer to Japanese Unexamined Patent Publication No. 6-112763).

Furthermore, there has been disclosed the cut-out angle of the substrate surface whereby the pseudo-longitudinal wave type leaky surface acoustic wave having a fast phase velocity and a small propagation loss can be used also in the lithium-tantalate substrate or the lithium-niobate substrate (refer to Japanese Unexamined Patent Publication No. 6-316781 and Japanese Unexamined Patent Publication No. 10-84245.)

Japanese Unexamined Patent Publication No. 6-112763 is a first example of related art.

Japanese Unexamined Patent Publication No. 6-31678 is a second example of related art.

Japanese Unexamined Patent Publication No. 10-84245 is a third example of related art.

However, it has been confirmed that when using the pseudo-longitudinal wave type leaky surface acoustic wave using the lithium-tantalate substrate, the lithium-niobate substrate, or the tetraboric-acid lithium substrate having an advantage of a large electromechanical coupling coefficient, a spurious frequency occurs in the range of the conventionally disclosed cut-out angle of the piezo-electric substrate, which is practically disadvantage.

For example, if the spurious occurs near the principal vibration in using the surface acoustic wave device as a resonator, CI (crystal impedance) value and Q value will be reduced, and also in the case of an oscillator forming an oscillator circuit, the spurious will be the causes of producing problems such as an abnormal oscillation, a frequency jump, and the like. Furthermore, when used as a filter, there is a problem that the spurious frequency has to be suppressed as much as possible over a wide range of the pass band from the need for securing a flat delay characteristic.

SUMMARY

An advantage of the invention is to improve CI value and Q value by suppressing the spurious effectively in the surface acoustic wave device using the pseudo-longitudinal wave type leaky surface acoustic wave, and thereby to provide a surface acoustic wave device, which facilitates attaining higher frequencies, a method of manufacturing the surface acoustic wave device, and an electronic apparatus including the surface acoustic wave device.

According to a first aspect of the invention, a surface acoustic wave device includes a lithium-tantalate substrate and an IDT electrode that excites a pseudo-longitudinal wave type leaky surface acoustic wave in the surface of the lithium-tantalate substrate, wherein a normalized substrate thickness $t/\lambda$, which is the thickness t of the lithium-tantalate substrate normalized by an IDT wavelength $\lambda$, is in a range of $1 \leq t/\lambda \leq 22$.

According to this configuration, the surface acoustic wave device whose spurious frequency is suppressed can be provided using the pseudo-longitudinal wave type leaky surface acoustic wave that propagates in the lithium-tantalate substrate. Moreover, in the case of an oscillator forming an oscillator circuit, problems, such as an abnormal oscillation and a frequency jump, can be prevented, and thus an oscillator with high stability can be provided.

According to a second aspect of the invention, it is preferable that in the surface acoustic wave device according to the first aspect, the cut-out angle of the surface of the lithium-tantalate substrate and the propagation direction of the pseudo-longitudinal wave type leaky surface acoustic wave are in a range of (90°, 90°, 0° through 180°) in Euler representation.

According to this configuration, it is possible to generate the pseudo-longitudinal wave type surface acoustic wave whose phase velocity is twice as fast as the Rayleigh wave, and the higher frequencies of the surface-acoustic wave device will be facilitated.

According to a third aspect of the invention, a surface acoustic wave device includes a lithium-niobate substrate and an IDT electrode that excites a pseudo-longitudinal wave type leaky surface acoustic wave in the surface of the lithium-niobate substrate, wherein a normalized substrate thickness $t/\lambda$, which is the thickness t of the lithium-niobate substrate normalized by an IDT wavelength $\lambda$, is in a range of $1 \leq t/\lambda \leq 29$.

According to this configuration, the surface acoustic wave device whose spurious frequency is suppressed can be provided using a pseudo-longitudinal wave type leaky surface acoustic wave that propagates in the lithium-niobate substrate. Moreover, in the case of an oscillator forming an oscillator circuit, problems, such as an abnormal oscillation and a frequency jump, can be prevented, and thus an oscillator with high stability can be provided.

According to a fourth aspect of the invention, it is preferable that in the surface acoustic wave device according to the third aspect, the cut-out angle of the surface of the lithium-niobate substrate and the propagation direction of the pseudo-longitudinal wave type leaky surface acoustic wave are in a range of (0°, 70° through 105°, 90°) in Euler representation.

According to this configuration, it is possible to generate the pseudo-longitudinal wave type surface acoustic wave whose phase velocity is twice as fast as the Rayleigh wave, and the higher frequencies of the surface-acoustic wave device will be facilitated.

According to a fifth aspect of the invention, a surface acoustic wave device includes a tetraboric acid lithium substrate and an IDT electrode that excites a pseudo-longitudinal wave type leaky surface acoustic wave in the surface of the tetraboric acid lithium substrate, wherein a normalized substrate thickness $t/\lambda$, which is the thickness t of the tetraboric acid lithium substrate normalized by an IDT wavelength $\lambda$, is in a range of $1 \leq t/\lambda \leq 17$.

According to this configuration, the surface acoustic wave device whose spurious frequency is suppressed can be provided using a pseudo-longitudinal wave type leaky surface acoustic wave that propagates in the tetraboric-acid lithium substrate. Moreover, in the case of an oscillator forming an oscillator circuit, problems, such as an abnormal oscillation and a frequency jump, can be prevented, and thus an oscillator with high stability can be provided.

According to a sixth aspect of the invention, it is preferable that in the surface acoustic wave device according to the fifth aspect, the cut-out angle of the surface of the tetraboric acid lithium substrate and the propagation direction of the pseudo-longitudinal wave type leaky surface acoustic wave are in a range of (0° through 45°, 30° through 90°, 40° through 90°) in Euler representation.

According to this configuration, it is possible to generate the pseudo-longitudinal wave type surface acoustic wave whose phase velocity is twice as fast as the Rayleigh wave, and the higher frequencies of the surface.

According to a seventh aspect of the invention, it is preferable that in the surface acoustic wave device according to the first aspect, the lithium-tantalate substrate, the lithium-niobate substrate, or the tetraboric-acid lithium substrate has a thickness in the outside of the IDT electrode formation region and in the thickness direction of the substrate, and has a reinforcement part provided in at least one of the IDT electrode formation face and the opposite face thereof.

If doing this way, the mechanical strength of the lithium-tantalate substrate, the lithium-niobate substrate, or the tetraboric-acid lithium substrate can be enhanced as compared with the case where the reinforcement part is not provided, and damages such as breakage of the substrate in the process can be prevented to thereby improve the yield.

According to an eighth aspect of the invention, an electronic apparatus includes a surface acoustic wave device as a filter or a resonator, wherein the surface acoustic wave device is the one according to the first aspect.

Accordingly, it is possible to provide the electronic apparatus having a resonator or a filter whose spurious frequency is suppressed, using the pseudo-longitudinal wave type surface acoustic wave, which propagates in the lithium-tantalate substrate, the lithium-niobate substrate, or the tetraboric-acid lithium substrate.

According to a ninth aspect of the invention, a method of manufacturing a surface acoustic wave device includes: a first step for adjusting the thickness of the lithium-tantalate substrate, the lithium-niobate substrate, or the tetraboric-acid lithium substrate; a second step for forming an IDT electrode which excites a pseudo-longitudinal wave type leaky surface acoustic wave in the surface of the lithium-tantalate substrate, or the lithium-niobate substrate, or the tetraboric-acid lithium substrate whose thickness is adjusted, and obtaining a surface acoustic wave element; a third step for housing and fixing the surface acoustic wave element in a package; wherein in the first step, the thickness of the lithium-tantalate substrate, the lithium-niobate substrate, or the tetraboric-acid lithium substrate is adjusted so that the normalized substrate thickness $t/\lambda$, which is the substrate thickness t normalized by the IDT wavelength $\lambda$, is set in a range of $1 \leq t/\lambda \leq 22$ for the lithium-tantalate substrate; $1 \leq t/\lambda \leq 29$ for the lithium-niobate substrate; and $1 \leq t/\lambda \leq 17$ for the tetraboric-acid lithium substrate.

According to this manufacturing method, because the thickness of the lithium-tantalate substrate, the lithium-niobate substrate, or the tetraboric-acid lithium substrate is adjusted prior to the formation of the IDT electrode, it is possible to suppress the spurious without damaging the IDT electrode, and manufacture the surface acoustic wave device, whose CI value and Q value are improved.

According to a tenth aspect of the invention, a method of manufacturing a surface acoustic wave device includes: a first step for forming an IDT electrode that excites a pseudo-longitudinal wave type leaky surface acoustic wave in the surface of the lithium-tantalate substrate, the lithium-niobate substrate, or the tetraboric-acid lithium substrate, and obtaining a surface acoustic wave element; a second step for shaving a face opposite to the formation face of the IDT electrode of the lithium-tantalate substrate, the lithium-niobate substrate, or the tetraboric-acid lithium substrate, and adjusting the thickness of the lithium-tantalate substrate, the lithium-niobate substrate, or the tetraboric-acid lithium substrate; and a third step for housing and fixing the surface acoustic wave element in a package, wherein in the second step, the thickness of the lithium-tantalate substrate, the lithium-niobate substrate, or the tetraboric-acid lithium substrate is adjusted so that the normalized substrate thickness $t/\lambda$, which is the thickness t of the substrate normalized by the IDT wavelength $\lambda$, is set in a range of $1 \leq t/\lambda \leq 22$ for the lithium-tantalate substrate; $1 \leq t/\lambda \leq 29$ for the lithium-niobate substrate; and $1 \leq t/\lambda \leq 17$ for the tetraboric-acid lithium substrate.

According to this manufacturing method, because the thickness of the piezo-electric substrate is adjusted after the formation of the IDT electrode, it is possible to prevent damages due to the handling of the thin piezo-electric substrate at the time of forming the IDT electrode, and improve the product yield.

According to an eleventh aspect of the invention, it is preferable that the method of manufacturing a surface acoustic wave device in the ninth aspect further includes: adjusting the frequency of the surface acoustic wave element after the third step, wherein the frequency adjustment is carried out shaving the face that faces, in the thickness direction, to the formation face of the IDT electrode of the lithium-tantalate substrate, or the lithium-niobate substrate, or the tetraboric-acid lithium substrate.

According to a twelfth aspect of the invention, it is preferable that in the method of manufacturing the surface acoustic wave device in the eleventh aspect, the frequency adjustment is shaving the face that faces, in the thickness direction, to the formation face of the IDT electrode of the lithium-tantalate substrate, or the lithium-niobate substrate, or the tetraboric-acid lithium substrate, by dry etching.

Thus, according to the eleventh and twelfth aspects, because the frequency adjustment can be carried out without damaging the IDT electrode of the piezo-electric substrate, it is possible to reduce the variation of the center frequency after the frequency adjustment, and manufacture a stable surface acoustic wave device with few changes over the years. Moreover, because the frequency variation with respect to the amount of etching is smaller as compared with the case where the frequency adjustment is carried out etching the IDT electrode formation face, an accurate frequency adjustment can be carried out. Then, a micro amount of etching can be controlled by using dry etching as the etching, and more accurate frequency adjustment can be carried out.

According to a thirteenth aspect of the invention, it is preferable that in the method of manufacturing the surface acoustic wave device according to the eleventh aspect, a preliminary frequency adjustment is carried out shaving at least one of the substrate surface of the IDT electrode formation face of the lithium-tantalate substrate, the lithium-niobate substrate, or the tetraboric-acid lithium substrate, and the surface of the IDT electrode, prior to the frequency adjustment.

According to the thirteenth aspect, when the frequency needs to be adjusted largely, the preliminary frequency adjustment is carried out coarsely by etching the IDT electrode formation face, first. Then an accurate frequency adjustment can be carried out by etching the face opposite to the IDT electrode formation face. If doing this way, the frequency adjustment can be carried out in a short time.

BRIEF DESCRIPTION OF THE DRAWINGS

The invention will be described with reference to the accompanying drawings, wherein like numbers reference like elements, and wherein.

DESCRIPTION OF THE EMBODIMENTS

Embodiments of the invention will now be described with reference to accompanying drawings.

A First Embodiment

Figure 1A:
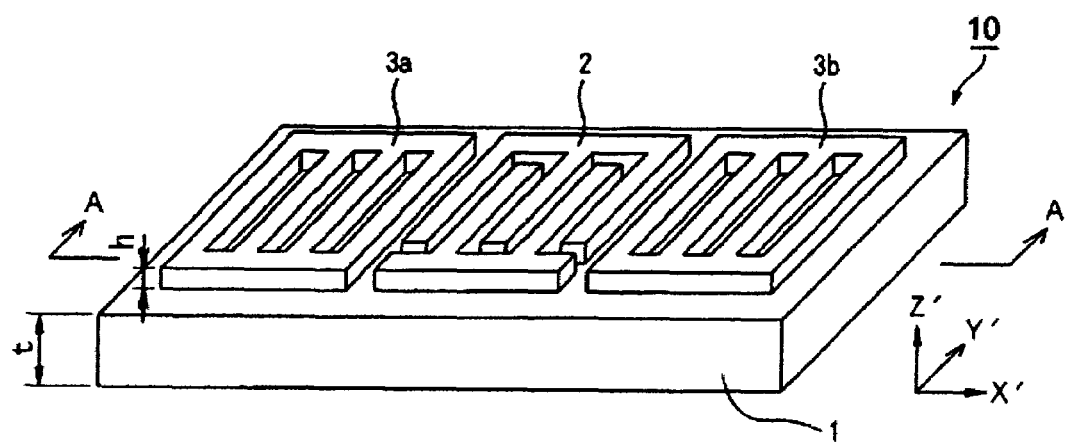
FIG. 1 is a schematic configuration view of a surface acoustic wave element concerning an embodiment of the invention.
Figure 1B:
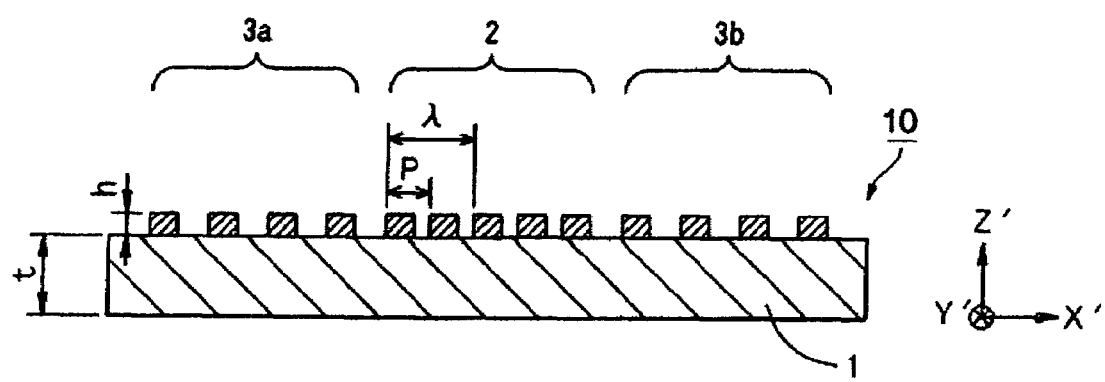

FIG. 1A is a perspective view showing a schematic configuration of a surface acoustic wave element concerning an embodiment, and FIG. 1B is the A-A sectional view of FIG. 1A.

A surface acoustic wave element 10 includes: a piezo-electric substrate 1 including the lithium-tantalate substrate, the lithium-niobate substrate, or the tetraboric-acid lithium substrate; and an IDT electrode 2 as well as reflector electrodes 3a and 3b formed on the surface of this piezo-electric substrate 1.

In FIG. 1, t is the thickness of the piezo-electric substrate 1, P is the pitch of the IDT electrode 2, λ is the IDT wavelength, and h is the thickness of the IDT electrode 2 and reflector electrodes 3a and 3b.

When the lithium-tantalate substrate is used as the piezo-electric substrate 1, the cut-out angle of the surface of the piezo-electric substrate 1 and the propagation direction (hereinafter, referred to as a "cut-out angle") of the pseudo-longitudinal wave type leaky surface acoustic wave are formed in a range of (90°, 90°, 0° through 180°) in Euler representation. Moreover, when the lithium-niobate substrate is used as the piezo-electric substrate 1, the cut-out angle of the surface of the piezo-electric substrate 1 is formed in a range of (0°; 70° through 105°, 90°) in Euler representation. Furthermore, when the tetraboric-acid lithium substrate is used as the piezo-electric substrate 1, the cut-out angle of the principal plane of the piezo-electric substrate 1 is formed in a range of (0° through 45°, 30° through 90°, 40° through 90°) in Euler representation. These cut-out angles of the piezo-electric substrate 1 are the conventionally known contents by Patent Documents 1, 2, and 3.

The thickness t of the piezo-electric substrate 1 is adjusted to such a value to fully suppress the spurious with each of the material of the piezo-electric substrate. This point will be described later.

The IDT electrode 2 excites the pseudo-longitudinal wave type leaky surface acoustic wave that propagates in parallel with a X-axis on the piezo-electric substrate 1, and the normalized thickness of the electrode h/λ is set to 0.02 or more. Here, the normalized thickness of the electrode h/λ is the thickness h of the IDT electrode 2 and reflector electrodes 3a and 3b normalized by the IDT wavelength λ. For example, if the IDT wavelength λ is 10 μm, the thicknesses h of the IDT electrode 2 and reflector electrodes 3a and 3b are set to 200 nm or more.

The reflector electrodes 3a and 3b reflect the pseudo-longitudinal wave type leaky surface acoustic wave generated in the IDT electrode 2, and confine the surface-wave energy in the IDT electrode 2.

Figure 2:
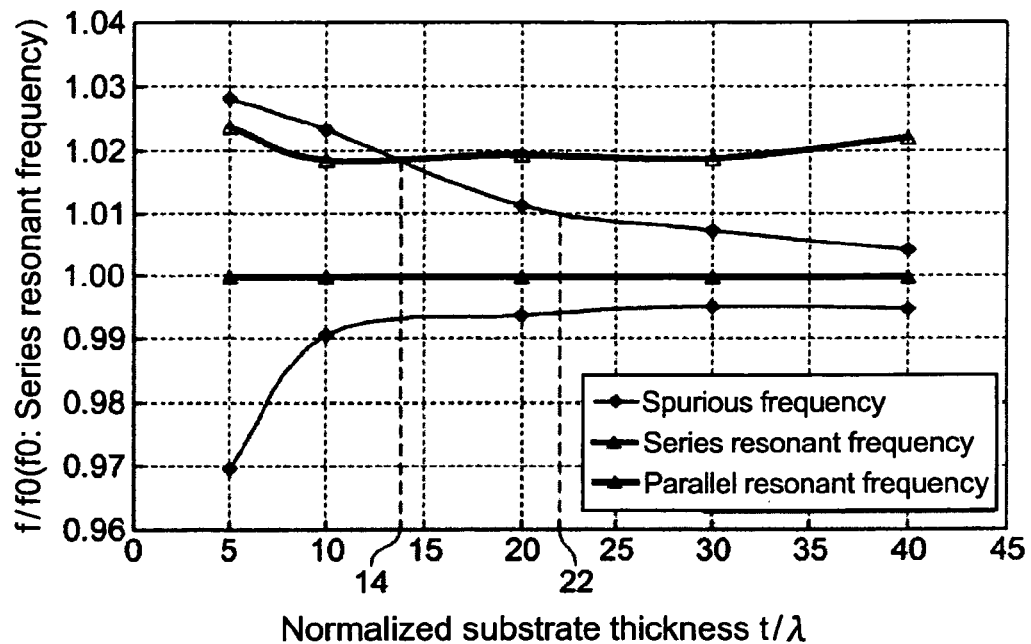
FIG. 2 is a graph showing variation of a spurious frequency with respect to a normalized substrate thickness t/λ in using a lithium-tantalate substrate.

FIG. 2 is a graph showing the variation of a series resonant frequency as well as a parallel resonant frequency, and the spurious frequency with respect to the normalized substrate thickness t/λ, when the resonator is fabricated using the lithium-tantalate substrate.

Here, the normalized substrate thickness t/λ is the substrate thickness t normalized by the IDT wavelength λ. For example, when the IDT wavelength λ is 10 μm, and if the substrate thickness t is 100 μm, then the normalized substrate thickness t/λ becomes 10.

In FIG. 2, the cut-out angle of the substrate is set to (90°, 90°, 30°) in Euler representation, and the normalized thickness of the electrode h/λ is set to 0.07. Moreover, the frequency f normalized by the series resonant frequency $f_0$ is the normalized frequency $f/f_0$, and the normalized frequency $f/f_0$ of the series resonant frequency of the principal vibration is set to 1.

Figure 3:
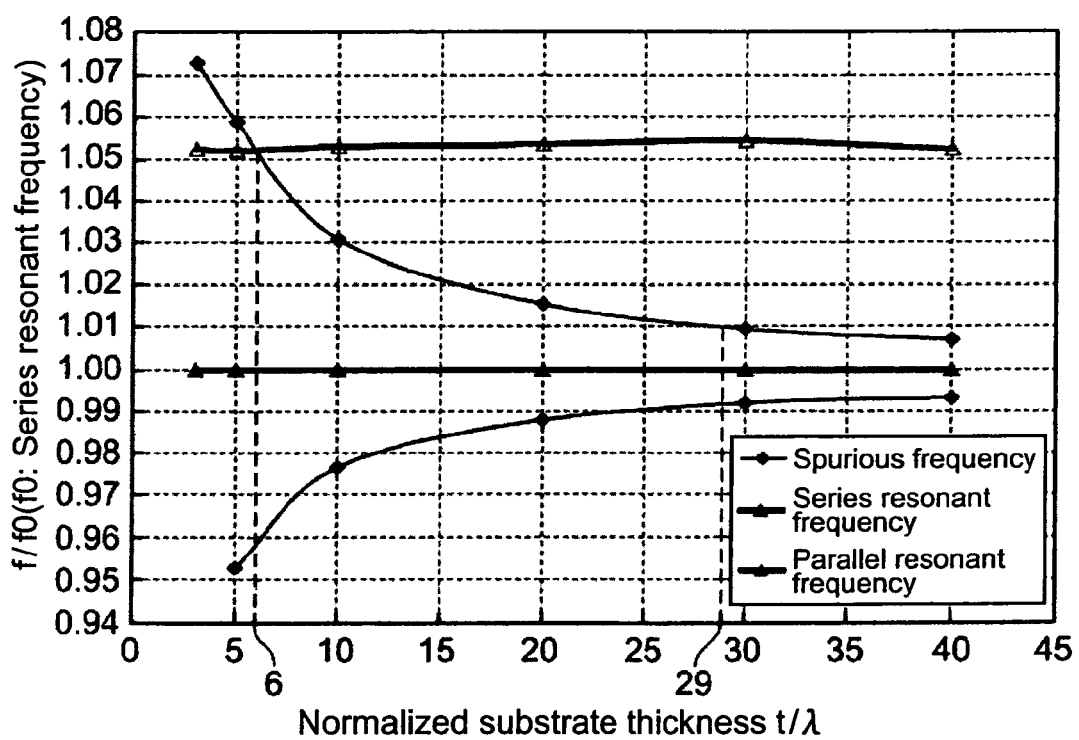
FIG. 3 is a graph showing variation of a spurious frequency with respect to the normalized substrate thickness t/λ in using a lithium-niobate substrate.

Likewise, FIG. 3 is a graph showing the variation of the series resonant frequency as well as the parallel resonant frequency, and the spurious frequency with respect to the normalized substrate thickness t/λ, when the resonator is fabricated using the lithium-niobate substrate. The cut-out angle of the substrate is set to (0°, 90°, 90°) in Euler representation, and the normalized thickness of the electrode h/λ is set to 0.07.

Figure 4:
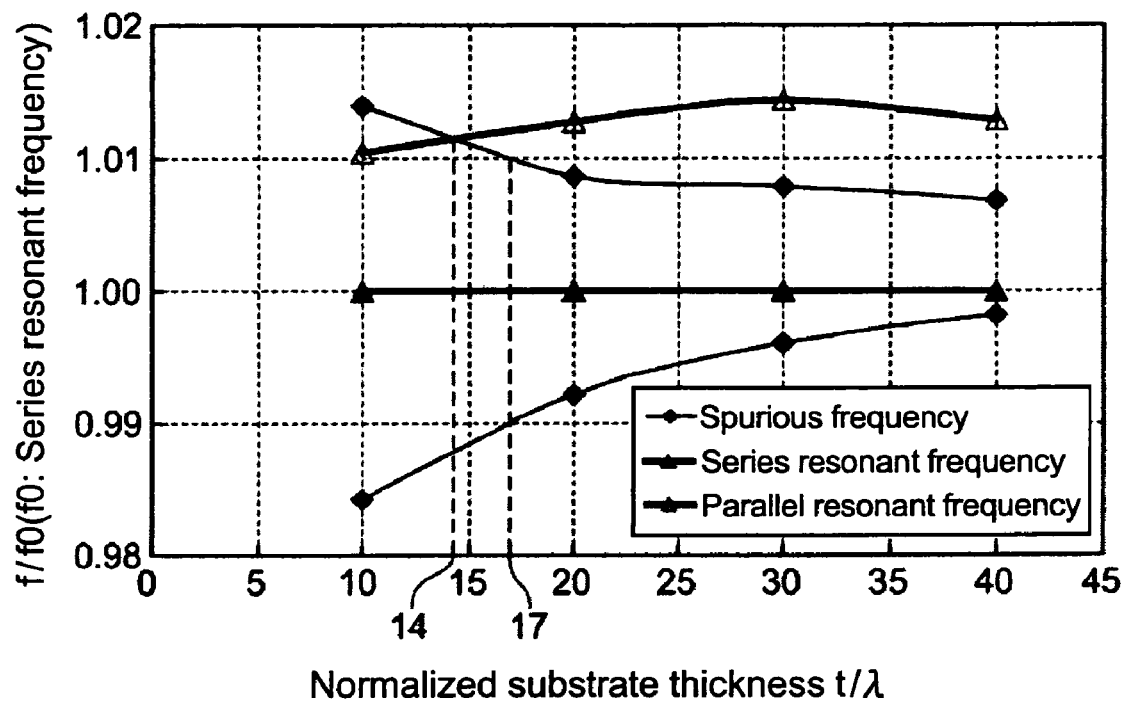
FIG. 4 is a graph showing variation of a spurious frequency with respect to the normalized substrate thickness t/λ in using a tetraboric-acid lithium substrate.

Further likewise, FIG. 4 is a graph showing the variation of the series resonant frequency as well as the parallel resonant frequency, and the spurious frequency with respect to the normalized substrate thickness t/λ, when the resonator is fabricated using the tetraboric-acid lithium substrate. The cut-out angle of the substrate is set to (0°, 46°, 90°) in Euler representation, and the normalized thickness of the electrode h/λ is set to 0.07.

It is apparent from the graphs of FIGS. 2, 3, and 4 that, commonly in each substrate, as the normalized substrate thickness t/λ decreases, the difference between the series resonant frequency of the principal vibration and the spurious frequency increases accordingly. That is, it can be understood that the spurious can be suppressed under the condition that the normalized substrate thickness t/λ is smaller than a certain value.

The cause of occurrence of the spurious is a higher-order mode of the bulk wave generated by the vibration of the entire piezo-electric substrate, and the resonant frequency is a standing wave determined by the thickness of the piezo-electric substrate. Therefore, the resonant-frequency difference between the standing waves having different orders increases by making a piezo-electric substrate thinner. That is, the frequency difference between the spurious and the principal vibration increases, allowing for the spurious to be suppressed.

The lower limit of the normalized substrate thickness t/λ just needs to be set to 1 or more in consideration of the substrate yield. This lower limit is set considering the following point. If the normalized substrate thickness t/λ is smaller than 1, the thickness of the piezo-electric substrate becomes extremely thin, and problems, such as breakage or chipping and the like of the piezo-electric substrate occur due to the handling or the like in the course of processing, thereby bringing the yield drop of the substrate.

This point will be described in detail. The IDT wavelength λ is expressed as λ=phase velocity (m/s)/resonant frequency (Hz). The phase velocity of the piezo-electric substrate shown in this example is about 5,000 through 7,000 (m/s). Here, a case of 2 GHz (2 Giga Hertz) resonant frequency, which is approximately the upper limit of the resonant frequency, and a phase velocity of the minimum value 5,000 (m/s) will be described as an example. At this time, λ=5,000/2,000,000,000=0.0000025, and the IDT wavelength λ becomes 2.5 μm. If t/λ=1, then t=λ, and the thickness of the piezo-electric substrate becomes extremely thin, 2.5 μm. The thickness 2.5 μm of the piezo-electric substrate is the thickness substantially near the lower limit of the processing, and if the thickness becomes this value or less, occurrence of breakage, chipping and the like will increase. If t/λ is smaller than 1, the thickness of the piezo-electric substrate becomes thinner further, and it is further highly likely that the problem will occur.

Moreover, although the upper limit of the normalized substrate thickness t/λ is preferably set under the condition that the spurious does not occur between the series resonant frequency and the parallel resonant frequency, the spurious that generates in a range in which the normalized frequency $f/f_0$ is higher than 1.01 will have an extremely high impedance because of the circuit configuration of the surface acoustic wave device, and thus it is unlikely that the spurious generates an abnormal oscillation. Therefore, practically a condition that the spurious does not occur in a range of 1.00 to 1.01 of the normalized frequency $f/f_0$ is sufficient.

Accordingly, from FIG. 2, when the lithium-tantalate substrate is used, the normalized substrate thickness t/λ capable of suppressing the spurious is preferably in a range of $1 \leq t/\lambda \leq 14$, and practically in a range of $$1 \leq t/\lambda \leq 22 \quad (1)$$

Moreover, from FIG. 3, when the lithium-niobate substrate is used, the normalized substrate thickness t/λ capable of suppressing the spurious is preferably in a range of $1 \leq t/\lambda \leq 6$, and practically in a range of $$1 \leq t/\lambda \leq 29 \quad (2)$$

Furthermore, from FIG. 4, when the tetraboric-acid lithium substrate is used, the normalized substrate thickness t/λ capable of suppressing the spurious is preferably in a range of $1 \leq t/\lambda \leq 14$, and practically in a range of $$1 \leq t/\lambda \leq 17 \quad (2)$$

Figure 5:
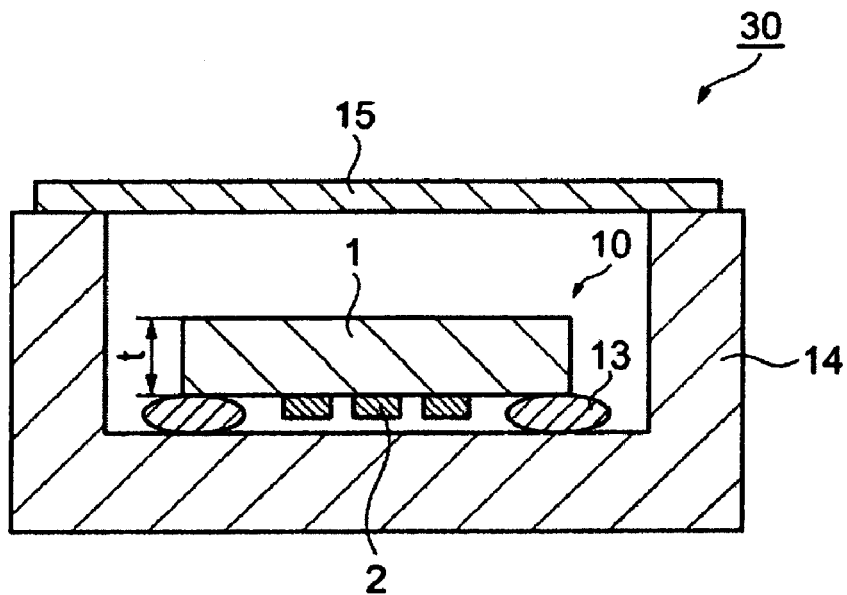
FIG. 5 is a schematic sectional view of the surface acoustic wave device concerning the embodiment of the invention.

FIG. 5 is a schematic cross section of a surface acoustic wave device that houses the above-described surface acoustic wave element 10 in a housing case.

One face of a housing case 14 formed of ceramics or the like is opened wide and a recess is provided there. In this recess, the surface acoustic wave element 10 composed of the piezo-electric substrate 1 is coupled into the housing case 14 via a gold bump 13 so that the IDT electrode 2 faces downward, thereby realizing electrical coupling and mechanical coupling simultaneously. Then, the upper face of the housing case 14 is sealed with a covering body 15, while the inside is being kept in a vacuum atmosphere or an inert gas atmosphere, thereby serving as a packaged surface acoustic wave device 30.

Thus, by using the piezo-electric substrate 1 including the lithium-tantalate substrate, the lithium-niobate substrate, or the tetraboric-acid lithium substrate, and by specifying the normalized substrate thickness t/λ of the piezo-electric substrate 1, which has not been specified in the design condition of the conventional surface acoustic wave, the spurious, which has been disadvantage when using the pseudo-longitudinal wave type leaky surface acoustic wave with a large phase velocity, can be suppressed effectively, and CI value and Q value can be improved. Moreover, by specifying the normalized substrate thickness t/λ of the piezo-electric substrate 1 in this way, the pseudo-longitudinal wave type leaky surface acoustic wave with a large phase velocity can be used, and higher frequencies of the surface acoustic wave device can be attained.

Modification of the First Embodiment

Figure 6:
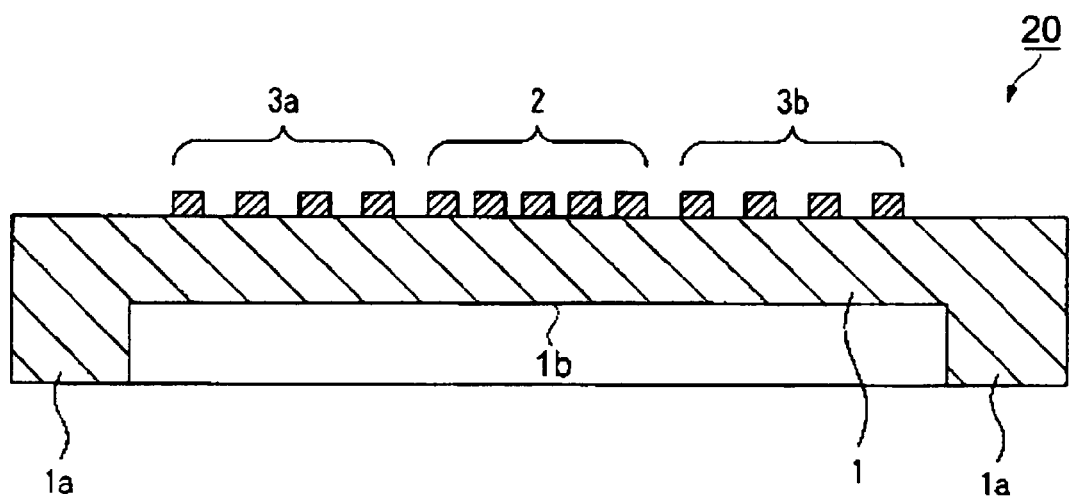
FIG. 6 is a schematic sectional view showing a modification of the surface acoustic element.

FIG. 6 is a schematic sectional view of a surface acoustic wave element showing a modification of the first embodiment.

A surface acoustic wave element 20 has a reinforcement part 1a provided in the piezo-electric substrate 1 including the lithium-tantalate substrate, the lithium-niobate substrate, or the tetraboric-acid lithium substrate. The reinforcement part 1a is provided along the peripheral part on the back-face 1b side as the opposite face having a relationship of the front and back with respect to the surface of the piezo-electric substrate 1, in which the IDT electrode 2 and reflector electrodes 3a and 3b are provided. This reinforcement part 1a is provided in the outside of the region opposite to the IDT electrode 2 and reflector electrodes 3a and 3b that are arranged in the surface side of the piezo-electric substrate 1. Moreover, the thickness of the piezo-electric substrate 1 of the region facing to the IDT electrode 2 and reflector electrodes 3a and 3b is adjusted to the thickness corresponding to each piezo-electric substrate material described in the first embodiment. Then, although not shown, the surface acoustic wave element 20 is housed in the housing case to complete as the surface acoustic wave device.

In addition, the arrangement of the reinforcement part 1a is not limited to the above-described configuration, but may be provided along the peripheral part at the surface side of the piezo-electric substrate 1, or may be provided along each peripheral part at the surface side and at the back face side of the piezo-electric substrate 1, respectively.

Thus, according to the modification, because the reinforcement part 1a is provided, the mechanical strength of the piezo-electric substrate 1 is enhanced as compared with the configuration without the reinforcement part 1a, thus allowing for the damages such as chipping in the process to be prevented, and allowing for the yield to be improved.

A Second Embodiment

Next, an embodiment of an electronic apparatus concerning the invention will be described.

Figure 7:
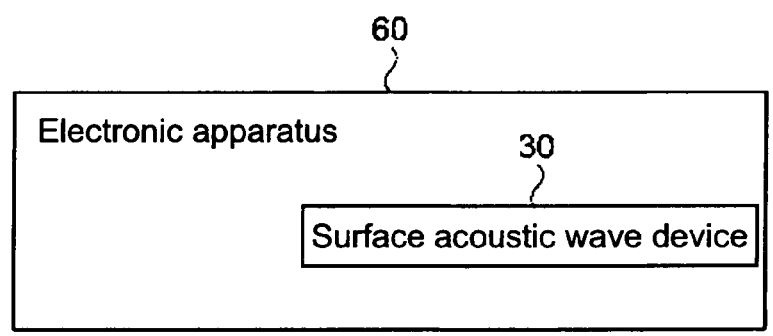
FIG. 7 is a configuration view of an electronic apparatus of an embodiment.

FIG. 7 is a schematic configuration view showing the configuration of the electronic apparatus. For example, a surface acoustic wave device 30 is provided in an electronic apparatus 60, such as a cellular phone and a keyless entry system. In the case of the cellular phone, the surface acoustic wave device 30 is used as a frequency selective filter, and in the case of the keyless entry system, the surface acoustic wave device 30 is used as a resonator of an oscillator. That is, the electronic apparatus 60 concerning this embodiment contains the surface acoustic wave device 30 as a filter or a resonator.

According to the electronic apparatus 60 comprising of such a configuration, it is possible to provide the electronic apparatus 60 using a filter and a resonator whose spurious is suppressed by using the pseudo-longitudinal wave type leaky surface acoustic wave that excites the piezo-electric substrate 1.

A Third Embodiment

Figure 8:
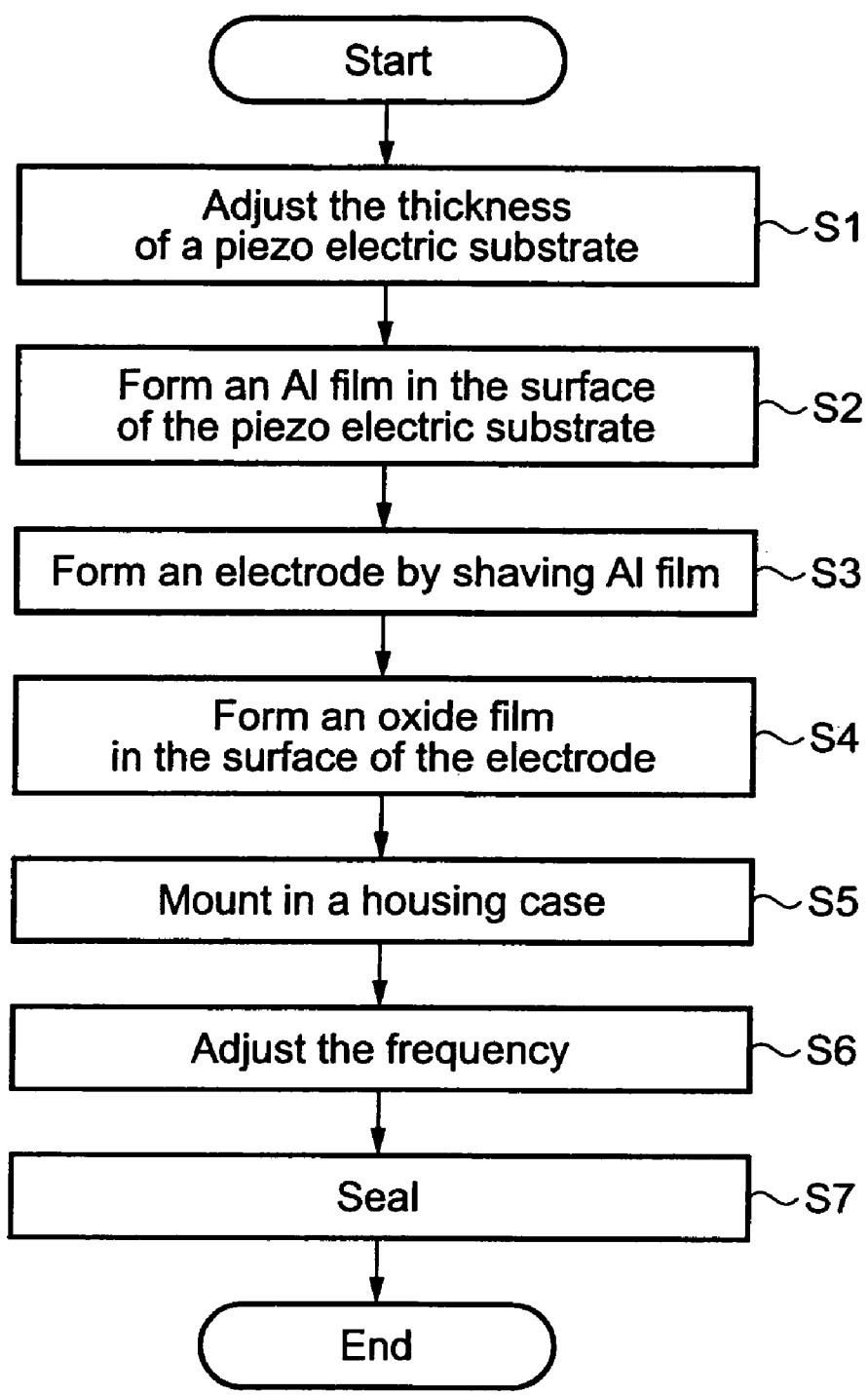
FIG. 8 is a flow chart explaining an embodiment of a method of manufacturing the surface acoustic wave device of the invention.

Next, an embodiment of a method of manufacturing the surface acoustic wave device concerning the invention will be described. FIG. 8 is a flow chart explaining the embodiment of the method of manufacturing the surface acoustic wave device. Here, the process until the surface acoustic wave element 10 shown in FIG. 1 is housed in the housing case 14 shown in FIG. 5, and completed as the surface acoustic wave device 30 will be described.

First, the thickness t of the piezo-electric substrate 1 is adjusted (Step S1). This piezo-electric substrate 1 is formed from the lithium-tantalate substrate, the lithium-niobate substrate, or the tetraboric-acid lithium substrate, and the cut-out angle of the substrate surface is cut out in a range of the angle described above, respectively. Adjustment of the thickness t of this piezo-electric substrate 1 is carried out shaving the front and back of the substrate uniformly by polish or etching. At this time, the thickness t of the piezo-electric substrate 1 is processed so as to meet the above equations (1), (2), and (3) corresponding to each substrate specified by the normalized substrate thickness t/λ.

Next, proceeding to Step S2, for example, a film of aluminum (Al) is film-formed on the surface of the piezo-electric substrate 1 whose thickness has been adjusted, with the method of vacuum evaporation or sputtering.

Then, proceeding to Step S3, the formed aluminum film is etched into a predetermined pattern, thereby forming the IDT electrode 2 and reflector electrodes 3a and 3b that excite the pseudo-longitudinal wave type leaky surface acoustic wave. Then, in Step S4, an oxide film is formed in the surface of the IDT electrode 2 and reflector electrodes 3a and 3b thereby to obtain the surface acoustic wave element 10.

Next, proceeding to Step S5, the surface acoustic wave element 10 is mounted (fixed) to the housing case 14, and in Step S6, frequency adjustment of the surface acoustic wave element 10 that is mounted to the housing case 14 is carried out. Then, proceeding to Step S7, the covering body 15 is secured to the upper face of the housing case 14, and sealed while the inside is being kept in a vacuum atmosphere or an inert gas atmosphere, thereby to serve as a packaged surface acoustic wave device.

In addition, as for the frequency adjustment in Step S6, the conventionally known method of etching the IDT electrode 2 and reflector electrodes 3a and 3b, or a method of etching the substrate face in which these electrodes are formed, may be sufficient, and further, a method of etching the substrate face opposite to the face in which the IDT electrode 2 is formed may be sufficient, as will be described in detail in an embodiment of a fourth embodiment.

As described above, according to this manufacturing method, because the thickness t of the lithium-tantalate substrate, the lithium-niobate substrate, or the tetraboric-acid lithium substrate is adjusted prior to the formation of the IDT electrode 2, the spurious can be suppressed without damaging the IDT electrode 2, and the surface acoustic wave device whose CI value and Q value are improved can be manufactured.

Figure 9:
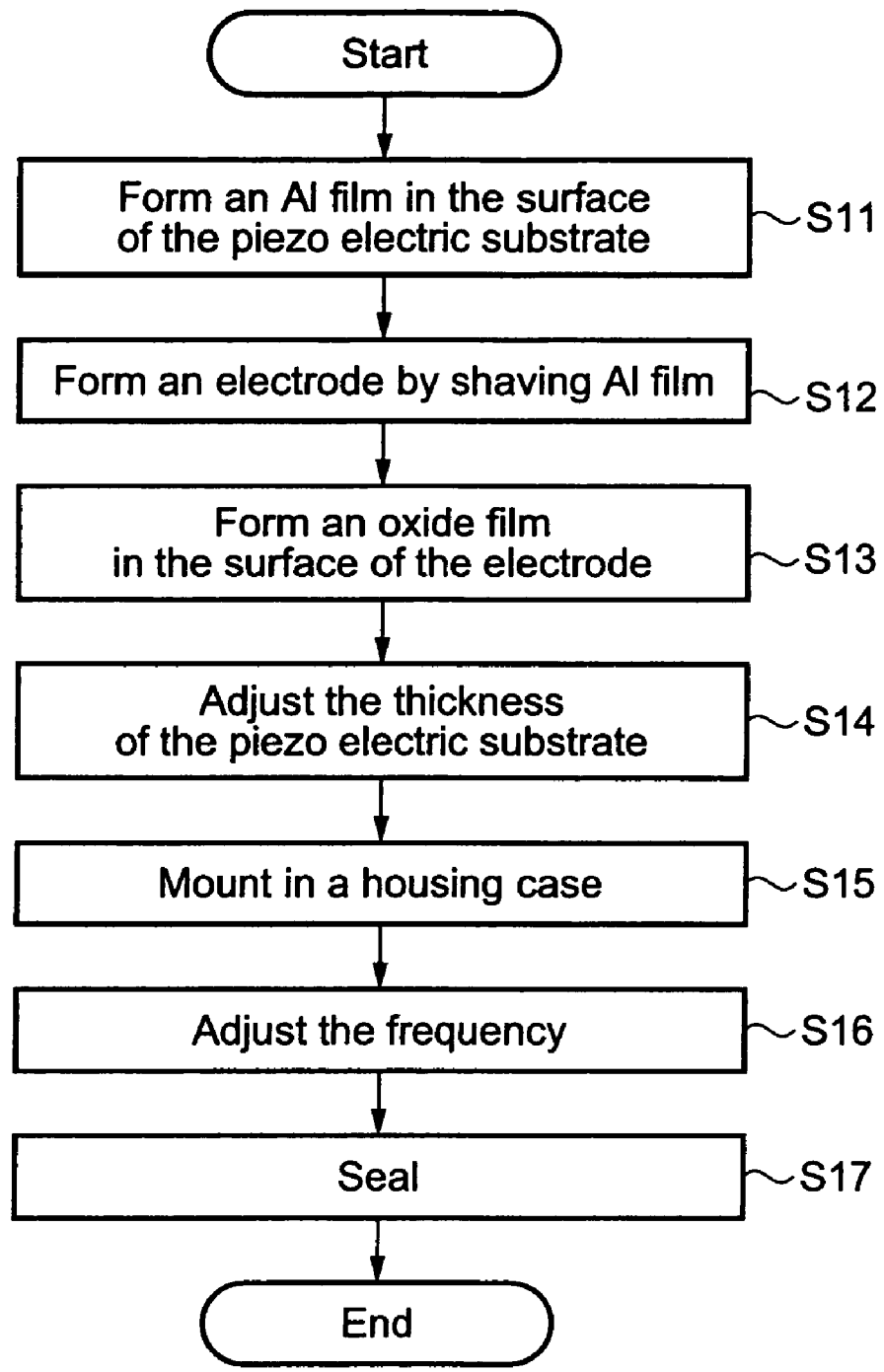
FIG. 9 is a flow chart explaining an embodiment of a method of manufacturing the surface acoustic wave device of the invention.

Next, another embodiment concerning this manufacturing method will be described. FIG. 9 is a flow chart explaining the embodiment of a method of manufacturing the surface acoustic wave device.

First, the piezo-electric substrate 1 formed of a predetermined thickness is prepared, and a film of aluminum (Al), for example, is formed in the surface of this piezo-electric substrate 1 (Step S11).

Then, proceeding to Step S12, the formed aluminum film is etched into a predetermined pattern, thereby forming the IDT electrode 2 and reflector electrodes 3a and 3b that excite a pseudo-longitudinal wave type leaky surface acoustic wave. Then, in Step S13, an oxide film is formed in the surface of the IDT electrode 2 and reflector electrodes 3a and 3b, thereby obtaining the surface acoustic wave element 10.

Next, proceeding to Step S14, the thickness t of the piezo-electric substrate 1 is adjusted. This adjustment of the thickness t of the piezo-electric substrate 1 is carried out shaving or etching the back face (the face opposite to the face in which the IDT electrode 2 is formed) of the piezo-electric substrate 1. At this time, the thickness t of the piezo-electric substrate 1 is processed so as to meet the above equations (1), (2), and (3) corresponding to each substrate specified by the normalized substrate thickness t/λ.

Next, proceeding to Step S15, the surface acoustic wave element 10 is mounted (fixed) to the housing case 14, and in Step S16, frequency adjustment of the surface acoustic wave element 10 that is mounted to the housing case 14 is carried out. Then, proceeding to Step S17, the covering body 15 is secured to the upper face of the housing case 14, and sealed while the inside is being kept in a vacuum atmosphere or an inert gas atmosphere, thereby to serve as a packaged surface acoustic wave device.

In addition, as for the frequency adjustment in Step S16, the conventionally known method of etching the IDT electrode 2 and reflector electrodes 3a and 3b, or a method of etching the substrate face in which these electrodes are formed may be sufficient, and further, a method of etching the substrate face opposite to the face in which the IDT electrode 2 is formed may be sufficient, as will be described in detail in the embodiment of the fourth embodiment.

According to this manufacturing method, because the thickness t of the piezo-electric substrate 1 is adjusted after the formation of the IDT electrode 2, it is possible to prevent the damages due to the handling of the thin piezo-electric substrate 1 at the time of forming the IDT electrode 2, and the product yield can be improved.

A Fourth Embodiment

Next, an embodiment of a method of manufacturing the surface acoustic wave device concerning the invention, especially a method of adjusting the frequency will be described. First, the principle of the frequency adjustment will be described prior to specific description of the method of adjusting the frequency of the surface acoustic wave element.

Generally, the frequency of a surface acoustic wave element depends on the effective thickness of the IDT electrode or the reflector electrode (hereinafter, both are combined to be referred to as the electrode), and as the thickness of the electrode becomes thinner, the frequency will increase, and decrease. By using this principle, the frequency adjustment of the surface acoustic wave element is carried out practically with the method of etching the electrode and increasing the frequency, and, in place of with a method of making the electrode thicker, with a method of shaving the substrate by using the electrode as a mask and increasing the apparent thickness of the electrode, thereby lowering the frequency.

Moreover, in the case of the surface acoustic wave element using the pseudo-longitudinal wave type leaky surface acoustic wave, it is possible to change the center frequency by adjusting the thickness of the substrate, because this pseudo-longitudinal wave type leaky surface acoustic wave is a surface acoustic wave which propagates while radiating energy in the depth (thickness) direction of the elastic body (a piezo electric crystal). That is, the frequency can be increased by etching the face that faces in the thickness direction of the face, in which the IDT electrode and reflector electrode are formed, and making the substrate thickness thinner.

Figure 10:
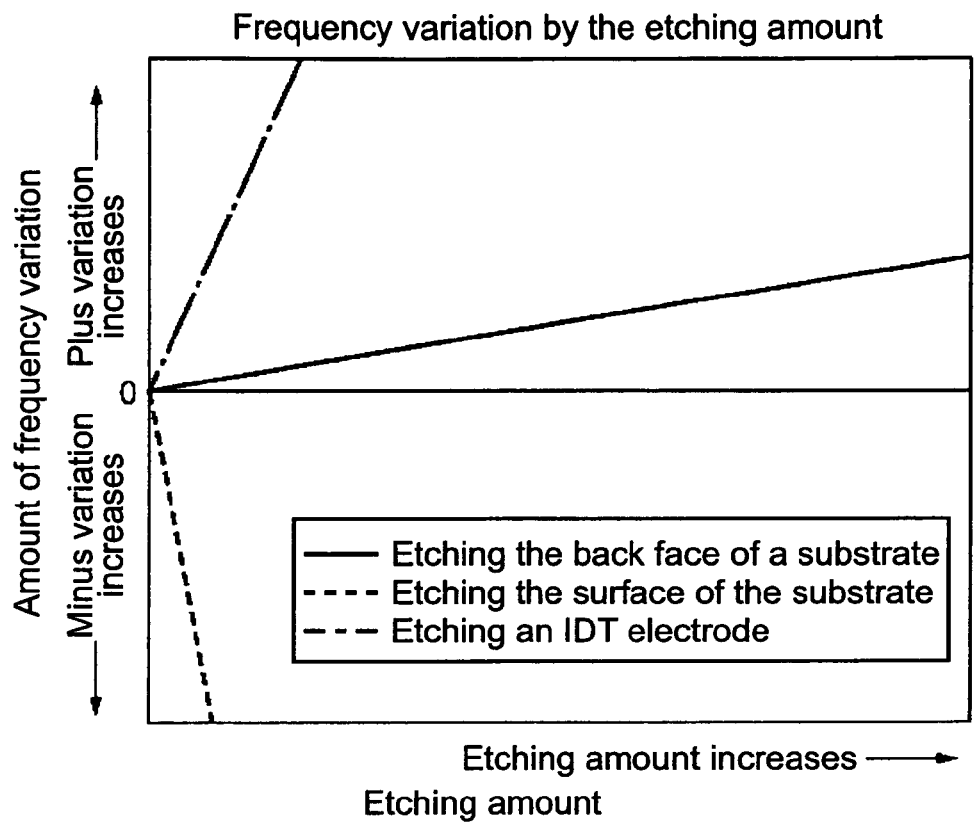
FIG. 10 is a graph showing a relationship between the etching amount and the frequency variation in a method of adjusting the frequency.

FIG. 10 is a schematic explanatory view showing the etching amount and the frequency variation in each method of adjusting the frequency of the surface acoustic wave device using the pseudo-longitudinal wave type leaky surface acoustic wave.

When the electrode thickness is made thinner by etching the surface of the IDT electrode, the amount of frequency variation is large with respect to the etching amount of the electrode, and the frequency changes in the increasing direction, as shown by the dash line. Moreover, when the piezo-electric substrate is etched using the electrode as a mask, the amount of frequency variation is large with respect to the etching amount of the piezo-electric substrate, and the frequency changes in the decreasing direction, as shown by the dotted line. On the other hand, when the substrate face opposite to the face in which the IDT electrode and the reflector electrode are formed is etched, the amount of frequency variation is small with respect to the etching amount of the piezo-electric substrate, and the frequency changes in the increasing direction, as shown by the solid line. This is apparently suitable for an accurate frequency adjustment, and suitable for the frequency adjustment of the surface acoustic wave element having an especially high frequency and a short IDT wavelength.

Figure 11:
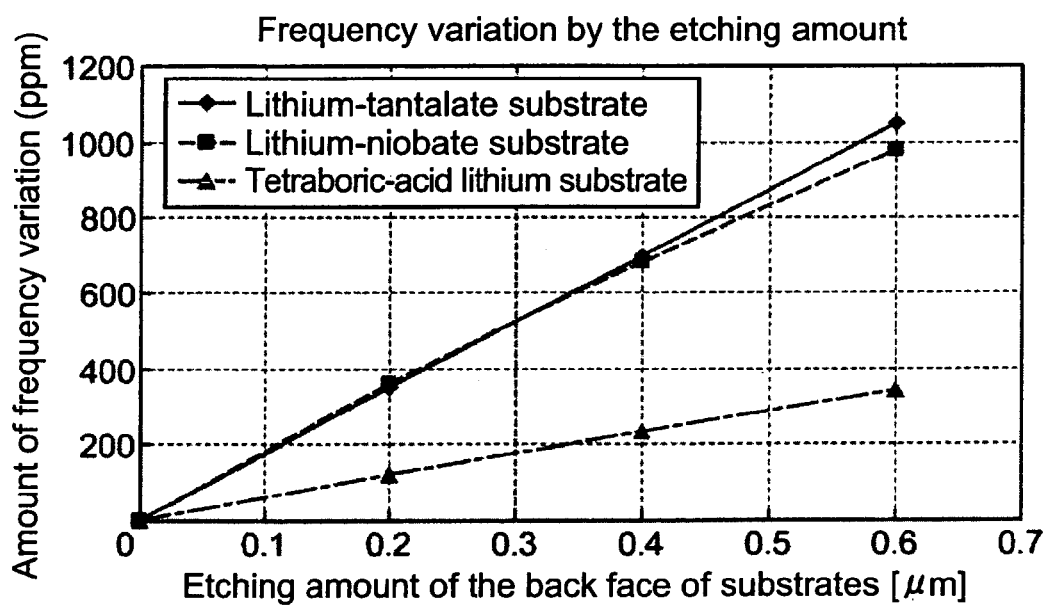
FIG. 11 is a graph showing a relationship between the etching amount of the substrate and the frequency variation in accordance with the substrate material.

FIG. 11 is a graph showing a relationship between the etching amount and the amount of frequency variation when etching the substrate face opposite to the face (the back face of the substrate), in which the IDT electrode and reflector electrode are formed, using the lithium-tantalate substrate, the lithium-niobate substrate, or the tetraboric-acid lithium substrate as the piezo-electric substrate.

Thus, when each of the substrate material described above is used, it is possible to carry out a highly accurate frequency adjustment in which the amount of frequency variation is small with respect to the etching amount of the back face of the substrate.

Then, a method of manufacturing the surface acoustic wave device concerning the invention enables an accurate frequency adjustment by etching the back face of the substrate in adjusting the frequency, with attention paid to the above-described point.

As for this method of etching the back face of the substrate, although either wet etching or dry etching is sufficient, a dry etching capable of controlling the etching amount finely is suitable.

Figure 12:
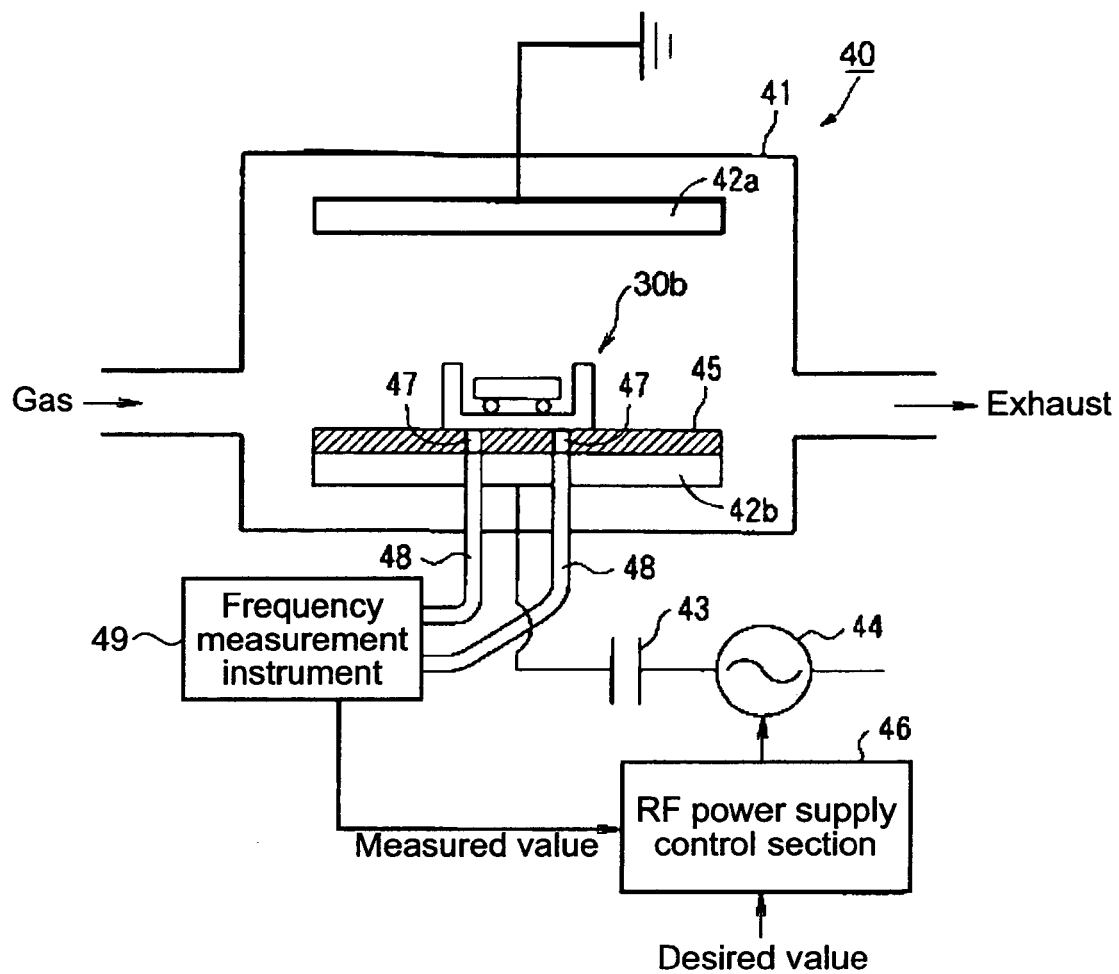
FIG. 12 is a schematic configuration view of an etching equipment.

Hereinafter, an etching equipment (a frequency-adjustment apparatus) used in this embodiment will be described. FIG. 12 is a schematic configuration view of the etching equipment.

An etching equipment 40 includes a chamber 41, and is configured to exhaust the inside of the chamber 41 and introduce gas into the chamber 41. Moreover, an upper part electrode 42a and a lower part electrode 42b are arranged in this chamber 41. The upper part electrode 42a is grounded, and the lower part electrode 42b is coupled to an RF power supply (a radio frequency power supply) 44 via a capacitor 43. A support 45 is provided on the lower part electrode 42b, and on top of this support 45, a surface acoustic wave device 30b, wherein the surface acoustic wave element is mounted to the housing case, can be mounted.

Moreover, in the support 45, a measurement terminal 47 for measuring the frequency of the pseudo-longitudinal wave type leaky surface acoustic wave generating from the surface acoustic wave device 30b is provided. This measurement terminal 47 is coupled to a frequency measurement instrument 49 via an electric cable 48.

The frequency measurement instrument 49 provides the measured center frequency to an RF power supply control section 46. The RF power supply control section 46 compares the provided measured center frequency with a desired value, and controls operation or the like of the RF power supply 44.

Figure 13:
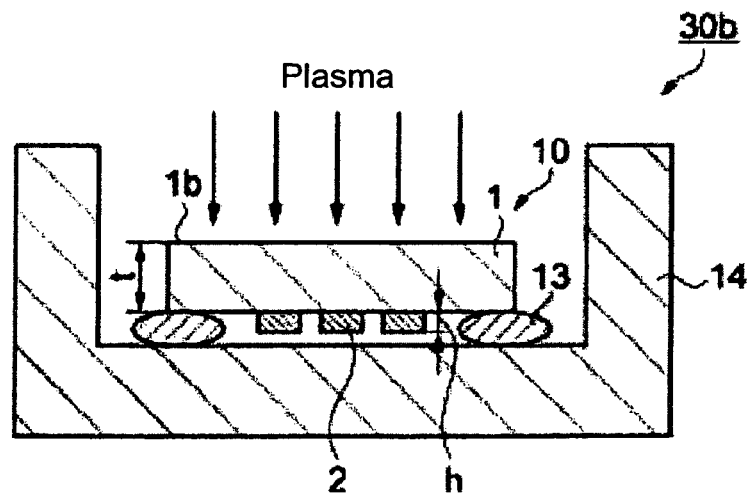
FIG. 13 is a sectional view explaining the etching condition of the surface acoustic wave device in the etching equipment.

When carrying out the frequency adjustment of the surface acoustic wave device 30b with the use of this etching equipment 40, as shown in FIG. 13, the surface acoustic wave device 30b, which is mounted so that the face (the back face of the substrate 1b) opposite to the formation face of the IDT electrode 2 of the piezo-electric substrate 1 faces upwards, is placed on the support 45.

Next, measurement of the center frequency of the surface acoustic wave device 30b is started by the frequency measurement instrument 49. Then, an etching gas is introduced into the chamber 41 while exhausting the inside of the chamber 41, and plasma is generated under a predetermined reduced pressure.

At this time, because a high-frequency voltage is being applied between the upper-part electrode 42a and the lower part electrode 42b by the RF power supply 44, ions generated in plasma are accelerated by the electric field, and thus etching of the back-face 1b of the surface acoustic wave element 10 is carried out. Accordingly, the center frequency to be measured will change and come close to the desired value by this etching.

During this etching, the frequency measurement instrument 49 carries out the measurement of the center frequency of the surface acoustic wave device 30b, and provides the measured value to the RF power supply control section 46. The RF power supply control section 46 compares the measured value with the predetermined desired value, and will stop operation of the RF power supply 44, if the measured value becomes the desired value. Thereby, the above-described etching will stop and the frequency adjustment is completed.

Figure 14:
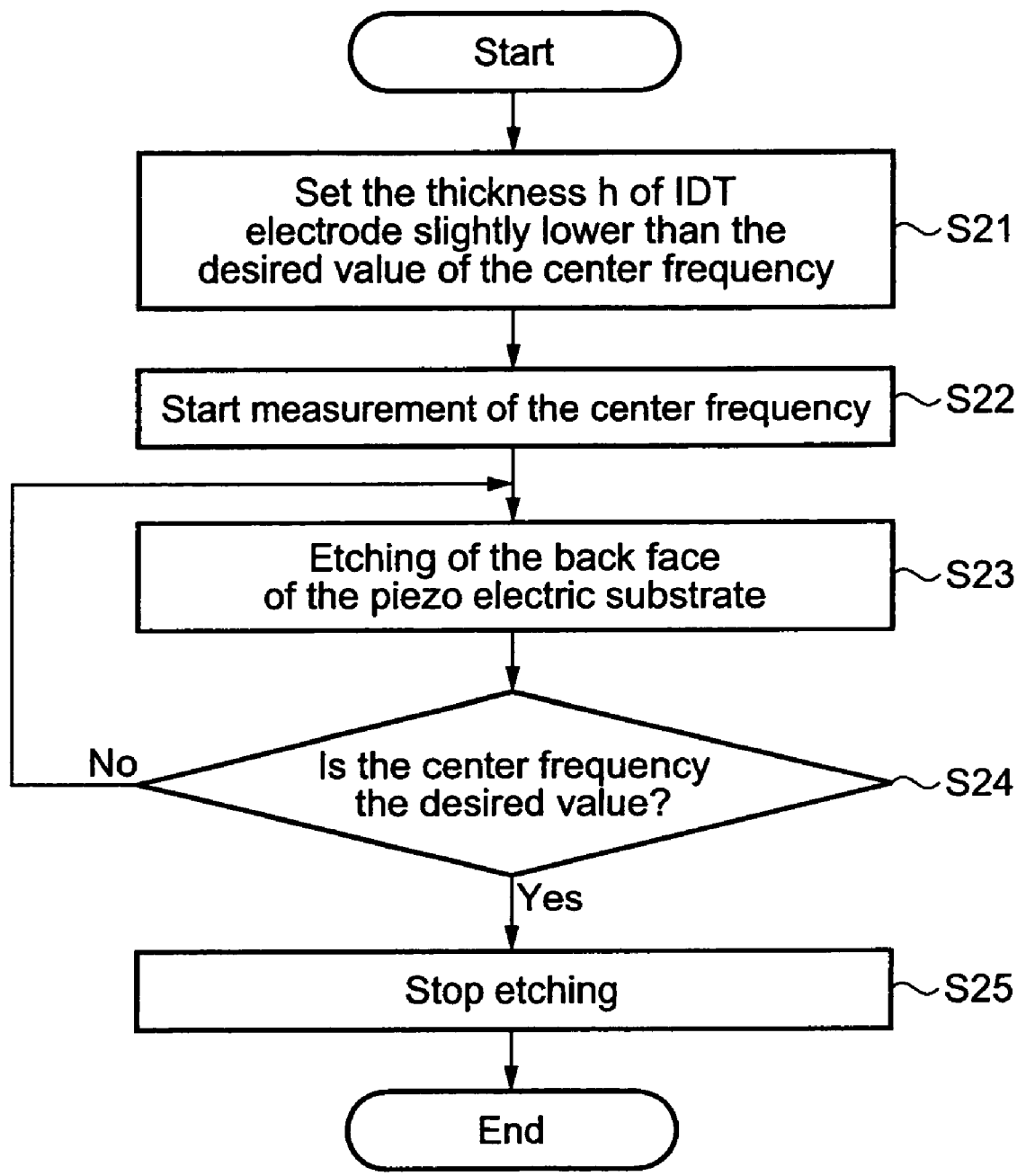
FIG. 14 is a flow chart explaining the steps of a method of adjusting the frequency.

A method of adjusting the frequency of the surface acoustic wave device using such an etching equipment 40 will be described with reference to a flow chart of FIG. 14. The piezo-electric substrate 1 is the lithium-tantalate substrate, the lithium-niobate substrate, or the tetraboric-acid lithium substrate described in the first embodiment, and the thickness and the cut-out angle of the substrate are adjusted to the predetermined value corresponding to each substrate.

First, in Step S21, the thickness h of the IDT electrode 2 formed on the piezo-electric substrate 1 is set as to be slightly thicker than the desired thickness, and so that the center frequency becomes slightly lower than the desired value. Next, the surface acoustic wave device 30b is installed in the chamber 41 of the etching equipment 40, and measurement (an input/output measurement) of the center frequency is started by applying voltage to the IDT electrode 2 (Step S22). Then, proceeding to Step S23, etching of the back face of the substrate 1b of the piezo-electric substrate 1 is carried out. Then, the center frequency to be measured will increase gradually, and come close to the desired value by the etching. In the next step S24, if the center frequency is not the desired value, the process will return to Step S23 to continue the etching, and if the center frequency becomes the desired value, the process proceeds to Step S25 to stop the etching. That is, measuring the center frequency while etching will be repeated, and the etching will be continued until the measured value becomes the desired value.

According to the above method of adjusting the frequencies, the center frequency can be adjusted to the desired value with sufficient accuracy by etching the back face of the substrate 1b of the piezo-electric substrate 1 having a small amount of frequency variation with respect to the etching amount.

Moreover, because the frequency adjustment can be carried out without damaging any of the electrodes formed in the piezo-electric substrate 1, the frequency variation after the adjustment caused by the remaining aluminum, which will be a problem at the time of etching the electrode with plasma or the like, can be prevented. Then, from this, it is possible to realize the surface acoustic wave device with few changes of the center frequency over the years, which operates stably in the long term.

Figure 15:
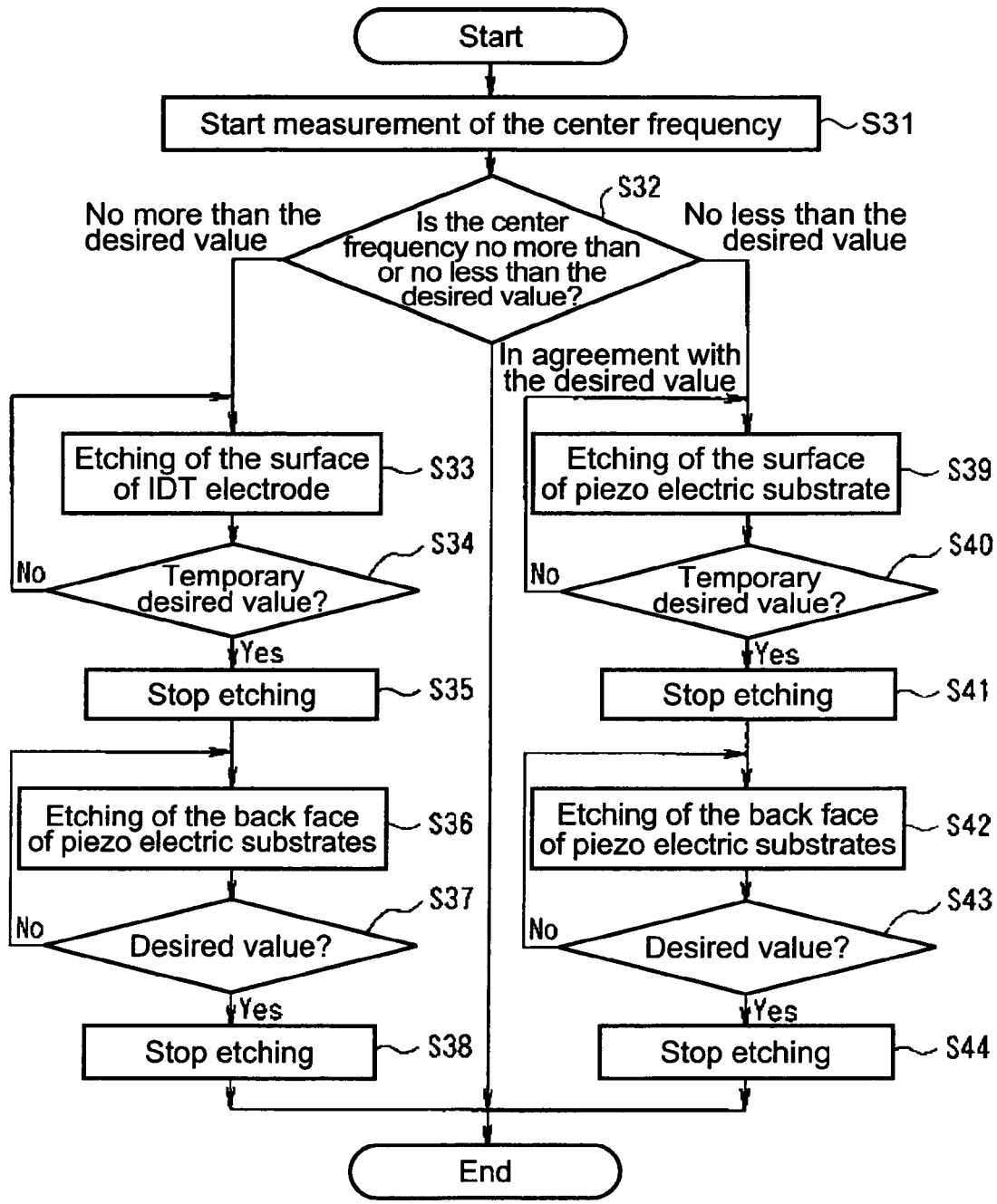
FIG. 15 is a flow chart explaining the steps of a method of adjusting the frequency.

Next, another method of adjusting the frequency will be described with reference to FIG. 15.

This method is a useful method in the case where there is a large variation, in terms of manufacturing, in the thickness and the like of the IDT electrode formed on the piezo-electric substrate of the surface acoustic wave device, and where frequency adjustment with sufficient accuracy is required.

First, measurement of the center frequency is started applying voltage to the IDT electrode 2, (Step S31). Next, whether the measured center frequency is no more than the desired value or no less than the desired value is judged (Step S32).

As a result of this judgment, if the measured center frequency is no more than the desired value, the process proceeds to Step S33, and if the measured center frequency is no less than the desired value, the process proceeds to Step S39. In addition, if the measured center frequency is in agreement with the desired value, the adjustment will be completed because the frequency adjustment is unnecessary.

In Step S33, etching, for example wet etching, of the surface of the IDT electrode 2 is carried out, while checking the measured frequency. Then, the center frequency to be measured will increase in a short time by the etching. Then, the etching is continued until the measured center frequency becomes a "temporary desired value", which is set slightly lower than the desired value of the center frequency (Steps S33 and S34), and at the time when it becomes the "temporary desired value", the etching will be stopped (Step S35). The above processing of Steps S33 and S34 serves as a coarse adjustment of the frequency (a preliminary frequency adjustment).

Next, etching of the back face of the substrate 1b of the piezo-electric substrate 1 is carried out using the etching equipment 40. This etching is carried out while checking the measured frequency (Step S36). Then, the center frequency to be measured will increase gradually, and come close to the desired value by the etching. Then, the etching is continued until the center frequency becomes the desired value (Steps S36 and S37), and at the time when it becomes the desired value, the etching will be stopped (Step S38). Processing of the above steps S36 and S37 serves as a fine adjustment of the frequency.

On the other hand, in Step S39, the substrate surface, which is the IDT electrode formation face of the piezo-electric substrate 1, is etched (for example, wet-etched). This etching is carried out while checking the measured frequency. Then, the center frequency to be measured will decrease in a short time by the etching. Then, the etching is continued until the measured center frequency becomes a "temporary desired value", which is set slightly lower than the desired value of the center frequency (Steps S39 and S40), and at the time when it becomes the "temporary desired value", the etching will be stopped (Step 41). The above processing of Steps S39 and S40 serves as the coarse adjustment of the frequency (the preliminary frequency adjustment).

Next, etching of the back face of the substrate 1b of the piezo-electric substrate 1 is carried out using the etching equipment 40. This etching is carried out while checking the measurement frequency (Step S42). Then, the center frequency to be measured will increase gradually, and come close to the desired value by the etching. Then, the etching is continued until the center frequency becomes the desired value (Steps S42 and S43), and at the time when it becomes the desired value, the etching will be stopped (Step S44). Processing of the above steps S42 and S43 serves as the fine adjustment of the frequency.

According to such a method of adjusting the frequency, even if there is variation in the desired value of the center frequency, the coarse adjustment of the frequency is carried out by etching the substrate surface of the piezo-electric substrate 1 or the surface of the IDT electrode 2 in a short time, and subsequently the fine adjustment of the frequency is carried out by etching the back face of the substrate 1b of the piezo-electric substrate 1, thereby allowing for an accurate frequency adjustment to be carried out in a short time as a whole.

Moreover, because the coarse adjustment of the frequency can be carried out with respect to the surface of the IDT electrode 2, or the surface of the piezo-electric substrate 1 by wet-etching, and the fine adjustment can be carried out with respect to the back face of the substrate 1b of the piezo-electric substrate 1 by dry etching, the frequency variation after the adjustment caused by the remaining aluminum, which will be a problem at the time of etching the surface of the piezo-electric substrate 1 with plasma or the like, can be prevented.

Accordingly, because the frequency adjustment can be carried out without damaging any of the electrodes formed in the piezo-electric substrate 1, it is possible to realize the surface acoustic wave device with few changes of the center frequency over the years, which operates stably in the long term.

In addition, in the above-described example, the coarse adjustment of the frequency is carried out by etching the surface of the piezo-electric substrate 1 (Steps S39 and S40) or by etching the surface of the IDT electrode 2 (Steps S33 and S34), and subsequently the fine adjustment of the frequency is carried out by etching the back face of the substrate 1b of the piezo-electric substrate 1, however, the following adjusting method is also possible.

Namely, as a result of the frequency measurement in Step S31, if the center frequency is no more than the above-described "temporary desired value", the process is immediately caused to proceed to the etching process of the back face of the substrate 1b of the piezo-electric substrate 1 (Step S36 or Step S42).

Moreover, as required, etching of the surface of the IDT electrode 2 is carried out, first, and then the etching of the surface of the piezo-electric substrate 1 is carried out, and finally etching of the back face of the substrate 1b of the piezo-electric substrate 1 is carried out, and thereby the center frequency may be adjusted to be the desired value.

What is claimed is:

1. A surface acoustic wave device, consisting of a lithium-tantalate substrate and an IDT electrode that excites a pseudo-longitudinal wave type leaky surface acoustic wave in the surface of the lithium-tantalate substrate, wherein a normalized substrate thickness $t/\lambda$, which is a thickness t of the lithium-tantalate substrate normalized by an IDT wavelength $\lambda$, is in a range of $1 \leq t/\lambda \leq 14$, and wherein a cut-out angle of the surface of the lithium-tantalate substrate and a propagation direction of the pseudo-longitudinal wave type leaky surface acoustic wave are (90°, 90°, 30°) in Euler representation.

2. A surface acoustic wave device, consisting of a lithium-niobate substrate and an IDT electrode that excites a pseudo-longitudinal wave type leaky surface acoustic wave in the surface of the lithium-niobate substrate, wherein a normalized substrate thickness $t/\lambda$, which is a thickness t of the lithium-niobate substrate normalized by an IDT wavelength $\lambda$, is in a range of $1 \leq t/\lambda \leq 6$, and wherein a cut-out angle of the surface of the lithium-niobate substrate and a propagation direction of the pseudo-longitudinal wave type leaky surface acoustic wave are (0°, 90°, 90°) in Euler representation.

3. A surface acoustic wave device, consisting of a tetraboric acid lithium substrate and an IDT electrode that excites a pseudo-longitudinal wave type leaky surface acoustic wave in the surface of the tetraboric acid lithium substrate, wherein a normalized substrate thickness $t/\lambda$, which is a thickness t of the tetraboric acid lithium substrate normalized by an JDT wavelength $\lambda$, is in a range of $1 \leq t/\lambda \leq 14$, and wherein a cut-out angle of the surface of the tetraboric acid lithium substrate and a propagation direction of the pseudo-longitudinal wave type leaky surface acoustic wave are (0°, 46°, 90°) in Euler representation.

4. The surface acoustic wave device according to claim 1, wherein the lithium-tantalate substrate, has a thickness in the outside of the IDT electrode formation region and in the thickness direction of the substrate, and has a reinforcement part provided in at least one of the IDT electrode formation face and the opposite face thereof.

5. An electronic apparatus comprising a surface acoustic wave device as a filter or a resonator, wherein the surface acoustic wave device is the surface acoustic wave device according to claim 1.

6. The surface acoustic wave device according to claim 2, wherein the lithium-niobate substrate has a thickness in the outside of the TDT electrode formation region and in the thickness direction of the substrate, and has a reinforcement part provided in at least one of the IDT electrode formation face and the opposite face thereof.

7. The surface acoustic wave device according to claim 3, wherein the tetraboric acid lithium substrate has a thickness in the outside of the IDT electrode formation region and in the thickness direction of the substrate, and has a reinforcement part provided in at least one of the LDT electrode formation face and the opposite face thereof.

* * * * *